US006449200B1

United States Patent
Nelson et al.

(10) Patent No.: US 6,449,200 B1
(45) Date of Patent: Sep. 10, 2002

(54) DUTY-CYCLE-EFFICIENT SRAM CELL TEST

(75) Inventors: Erik A. Nelson, Waterbury; Harold Pilo, Underhill, both of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/907,325

(22) Filed: Jul. 17, 2001

(51) Int. Cl.[7] ................................................. G11C 7/00
(52) U.S. Cl. ....................................... 365/201; 365/194
(58) Field of Search ........................... 365/201, 189.01, 365/230.06, 194

(56) References Cited

U.S. PATENT DOCUMENTS

| | | | |
|---|---|---|---|
| 4,879,690 A | * | 11/1989 | Anami et al. ................ 365/201 |
| 5,276,647 A | | 1/1994 | Matsui et al. |
| 5,477,176 A | | 12/1995 | Chang et al. |
| 5,881,010 A | | 3/1999 | Artieri |
| 6,005,796 A | | 12/1999 | Sywyk et al. |
| 6,081,466 A | | 6/2000 | McClure et al. |
| 6,104,650 A | | 8/2000 | Shore |
| 6,208,572 B1 | | 3/2001 | Adams et al. |

FOREIGN PATENT DOCUMENTS

| | | |
|---|---|---|
| EP | 0590982 A2 | 4/1994 |
| EP | 0615253 A2 | 9/1994 |
| JP | 4232693 A | 1/1994 |
| JP | 11317097 A | 11/1999 |

* cited by examiner

*Primary Examiner*—Vu A. Le
(74) *Attorney, Agent, or Firm*—Frederick W. Gibb, III; Howard J. Walter, Jr.

(57) ABSTRACT

A method and structure for the invention includes an integrated memory structure having a built-in test portion. The integrated memory structure has memory cells, bitlines and wordlines connected to the memory cells, wordline decoders connected to a plurality of the wordlines, bitline restore devices connected to the bitlines for charging the bitlines during read and write operations, and a clock circuit connected to the wordlines. During a test mode the wordline decoders simultaneously select multiple wordlines that the bitline restore devices maintain in an active state and the clock circuit maintains th multiple wordlines and the bitline restore devices in an active state for a period in excess of a normal read cycle. The invention also includes transistors which are connected to the memory cells. The transistors include bitline contacts which are stressed during the test mode.

33 Claims, 7 Drawing Sheets

DUTY-CYCLE-EFFICIENT SRAM CELL TEST

BACKGROUND OF THE INVENTION

1. Field of the Invention

The present invention generally relates to the testing of semiconductor memory cells and more particularly to an improved method and structure for stressing and testing contacts within semiconductor structures.

2. Description of the Related Art

A typical semiconductor static random-access memory (SRAM) device includes word lines, a pair of bit lines, and memory cells with cell latches and pass devices connected at intersections between the word lines and the pair of bit lines. The pass devices of the memory cells are connected to the pair of bit lines through bitline contacts. During a read or write operation, these bitline contacts allow the contents of the memory cell to be successfully read from or written into the cell latch. Bitline contacts that have too much resistance (resistive bitline contacts) will not properly allow the memory cell to be read from or written into. Resistive bitline contacts may occur as a result of mechanical failures or non-conductive materials that are formed between the pass devices and the bitline, and are hard to detect since the pass devices have a large series resistance (e.g., typically in the 10 Kohm range) compared to the resistive bitline contact.

Although bitline contacts may be tested with the testing of the memory cell or bitlines, most manufacturing tests have difficulty recognizing a borderline resistive bitline contact and will generally pass the bitline contact and memory cell. When the resistive bitline contact is then used in the system under a slightly different voltage and/or temperature, the resistive bitline contact may then fail, rendering the corresponding memory cell inoperable.

The six-transistor SRAM cell shown in FIG. 1 continues to be the workhorse in both embedded and stand-alone high-performance SRAM arrays. In FIG. 1, the wordline is represented by WL, the bitline true and a bitline complement are represented by BLT and BLC, respectively, the various transistors are represented by an upper case "T" followed by a distinguishing number, and the nodes of the cell are identified as "A" and "B". The performance advantage of the six-transistor SRAM cell is attributed to the fully differential rail-to-rail cell nodes (nodes A and B in FIG. 1) that provide the maximum overdrive to cross-coupled N-type field effect transistors (NFET) devices T3 and T4 during a read cycle.

Furthermore, cell nodes are fully written shortly after the activation of the wordline as P-type field effect transistors (PFET) devices T1 or T2 restore a full differential on a cell node that would otherwise be partially written to approximately VDD-Vtn through wordline devices T5 or T6. The strength of the wordline devices T5 and T6 is normally designed to be weaker than that of the latch pull-down devices T3 and T4 to maintain cell stability, especially during high voltage operation and burn-in. The latch pull-down devices are designed to supply enough read current (with wordline devices in series) to discharge 100 mV from a VDD-precharged bitline in 700 ps. Such device characteristics result in a very high impedance bitline discharge path.

FIG. 2 shows an equivalent schematic representation of the bitline and cell during a read cycle. Prior to the start of a read cycle, a distributed bitline capacitance (CBL) is precharged to VDD. A bitline is then discharged through the following components: bitline resistance (RB), bitline contact resistance (RC), wordline device resistance (RW) (T5 in FIG. 1), and finally latch pull-down device resistance (RD) (T3 in FIG. 1). Typical resistances for all components are also shown. The resistance of a good bitline contact (RC) normally ranges from 2Ω–5Ω while the combined series resistance of the wordline device and the latch pull-down device is approximately 15 KΩ, as shown in FIG. 2.

The source/drain structures are commonly used by adjacent memory cells and are isolated from each other with Shallow Trench Isolation (STI). Above the STI there is generally layer of silicon nitride that is used as an etch stop for the contacts. The contacts are drilled first through the dielectric, and then through the nitride, exposing the silicided silicon surface. The contacts are generally lined with titanium nitride then filled with tungsten.

However, if the contact and source/drain regions are not properly aligned, if the opening for the contact is not formed completely through the insulator to the source/drain region, or if the conductive material does not completely fill the contact opening, there can be substantial resistance between the source/drain regions of the transistor and the contact material. For example, the silicon nitride may not be substantially removed prior to deposition of the metal in the contact opening. In such a situation, it is difficult to locate the actual conduction path through this failing contact. Since the expected resistance of the metallic stack including the contact is on the order of a few ohms, it can be predicted that the original resistance of the defective stack was on the order of many thousands of ohms.

Thus, the relationship between the bitline contact resistance and the devices series resistance makes it extremely difficult to detect marginal, resistive and unreliable bitline contacts. Process defects can cause significant increases in the bitline contact resistance with little or no impact on the SRAM read operation. FIG. 3A shows the waveforms of a read cycle with bitline contacts having different RC (RC=5Ω and RC=20 KΩ) as well as the timing of the setting of the sense amplifier (SET) and the timing of the wordline pulse (WL).

Even when the resistance is changed a very large amount (from 5Ω to 20,000Ω), the signal loss at the sense-amplifier at the time of setting is only 39%. This is shown in FIG. 3B where the signal loss of 46 mV (118 mV–72 mV) between the different bitline contact resistances is shown at the time the sense amplifier is set (SET). Thus, as shown, any significant increase in bitline-contact resistance caused by a defect will not disturb a read cycle to the point of failure. Indeed, read cycles may only be effective in detecting and screening resistive bitline contacts with resistances greater than 40 KΩ.

To the contrary, resistive bitline contacts are far more critical during a write operation because a differential write driver must overcome the cell latch nodes through wordline devices T5 or T6 and bitline contact resistance RC. The amount of signal excursion that must occur at the cell nodes has to be greater than 60% of the supply level to overcome the latch PFET-feedback device. At this point, the latch is then flipped and the latch NFET device finalizes the transition. The path to override the latch PFET-feedback must have an impedance less than that of the PFET, and the transition must occur before the wordline device is deactivated at the end of the write operation. FIG. 4 shows the write operation with different bitline contact resistances of RC=5Ω, RC=10 KΩ, and RC=15 KΩ. As shown in FIG. 4, the cell nodes A and B fail to be written when RC is greater than 15 KΩ at nominal conditions. At 15 KΩ, the cell nodes are written, but with very little margin to the falling edge of the wordline. Thus, the threshold of detectability of resistive bitline contacts is more critical during a write operation, compared to a read operation by approximately 2×. An inability to detect and screen out bitline contacts with resistances approaching 20 KΩ (4,000 times greater than nominal) will lead to shipments of SRAMs with highly resistive, potentially unreliable bitline contacts.

One alternative that improves the detectability of resistive contacts is to shorten the width of the wordline by speeding up the falling edge of the wordline pulse. Referring back to FIG. 4, if the falling edge of the wordline is sped up by approximately 400 ps then the write of the cell with an RC of 10 KΩ does not occur since the cell nodes are not switched before the wordline device is disabled. The effectiveness of this approach, however, is very limited since the pulse width of the wordline must be long enough to provide robust write margins across the process window and voltage/temperature variations.

Therefore, there is a need for a structure and method of identifying when the bitline contact resistance is even marginally above the optimum standard. Present technologies have great difficulty detecting slightly elevated bitline contact resistances because the read and write actions to and from the memory cells can initially be performed even with extremely high bitline contact resistance values. As these elevated bitline contact resistant devices are used by the consumer, they suffer additional thermal cycles, shock cycles, etc., and their resistance tends to increase, which causes the devices to fail. Therefore, the initial testing done immediately after manufacturing may not detect defects which will arise only after the devices have seen some period of actual consumer use. The invention described below overcomes these problems by providing a structure and method that supplies a large amount of stress upon the bitline contacts. This allows those bitline contacts which are initially only marginally acceptable (and which will probably become defective after some period of use) to be immediately identified directly after manufacture.

SUMMARY OF THE INVENTION

The process scaling and the need for smaller SRAM cells challenges process technologies to make millions of robust and reliable bitline contacts on a single chip. This makes it difficult to identify marginal, resistive and unreliable bitline contacts given the inherent electrical characteristics of the SRAM cell. The invention described below overcomes these problems by providing a structure and method that supplies a large amount of stress upon the bitline contacts. This allows those bitline contacts which are initially only marginally acceptable (and which will probably become defective after some period of use) to be immediately identified directly after manufacture.

The invention includes an integrated memory structure having a built-in test portion, memory cells, bitlines and wordlines connected to the memory cells, wordline decoders connected to a plurality of the wordlines, bitline restore devices connected to the bitlines for charging the bitlines during read and write operations, and a clock circuit connected to the wordlines. During a test mode the wordline decoders simultaneously select multiple wordlines that the bitline restore devices maintain in an active state and the clock circuit maintains the multiple wordlines and the bitline restore devices in an active state for a period in excess of a normal read cycle. The invention also includes transistors which are connected to the memory cells. The transistors include bitline contacts which are stressed during the test mode.

The invention also contains address generators connected to the wordline decoders. The address generators also include logic that simultaneously activates the multiple wordlines. The address generators have an OR circuit that activates both true and compliment addresses simultaneously. In addition, the invention selects multiple wordlines adjacent to one another. The two adjacent memory cells share a bitline contact which are simultaneously selected. The invention has memory cells which are static random access memory (SRAM) cells.

More specifically, the invention provides a test mode to efficiently stress SRAM cells. Specifically, this test mode is designed to maximize the stress duty-factor of each cell by a factor greater than 10,000 when compared to conventional test methods/structures.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As mentioned above, there is a need to identify bitline contacts that have resistance values even marginally above the optimum standard. Present technologies have great difficulty detecting slightly elevated bitline contact resistances because the read and write actions to and from the memory cells can initially be performed even with extremely high bitline contact resistance values. However, the initial testing done immediately after manufacturing may not detect defects which will arise only after the devices have seen some period of actual consumer use.

The invention described below overcomes these problems by providing a structure and method that supplies a large amount of stress upon the bitline contacts. This allows those bitline contacts which are initially only marginally acceptable (and which will probably become defective after some period of use) to be immediately identified directly after manufacture. More specifically, the invention provides a test mode to efficiently stress SRAM cells. Specifically, this test mode is designed to maximize the stress duty-factor of each cell by a factor greater than 10,000 when compared to conventional test methods/structures.

Today's dense SRAM cores have a very low degree of stressability as a result of the large number of words. For example, in a 16 Mb SRAM, each cell is stressed during only one of 14.6M cycles. This very low duty factor inhibits efficient stressing and as a result, SRAM reliability has been greatly impacted. Weak cells that are virtually undetectable with any test means exist and will fail in the field unless they can be stressed and screened prior to customer shipments. The invention provides the means to perform a useful stress prior to factory screening by significantly increasing the duty factor. This improvement can be obtained with a very small increase in active current and a less than 1% chip area increase (depending on the efficiency target).

Figure 5:
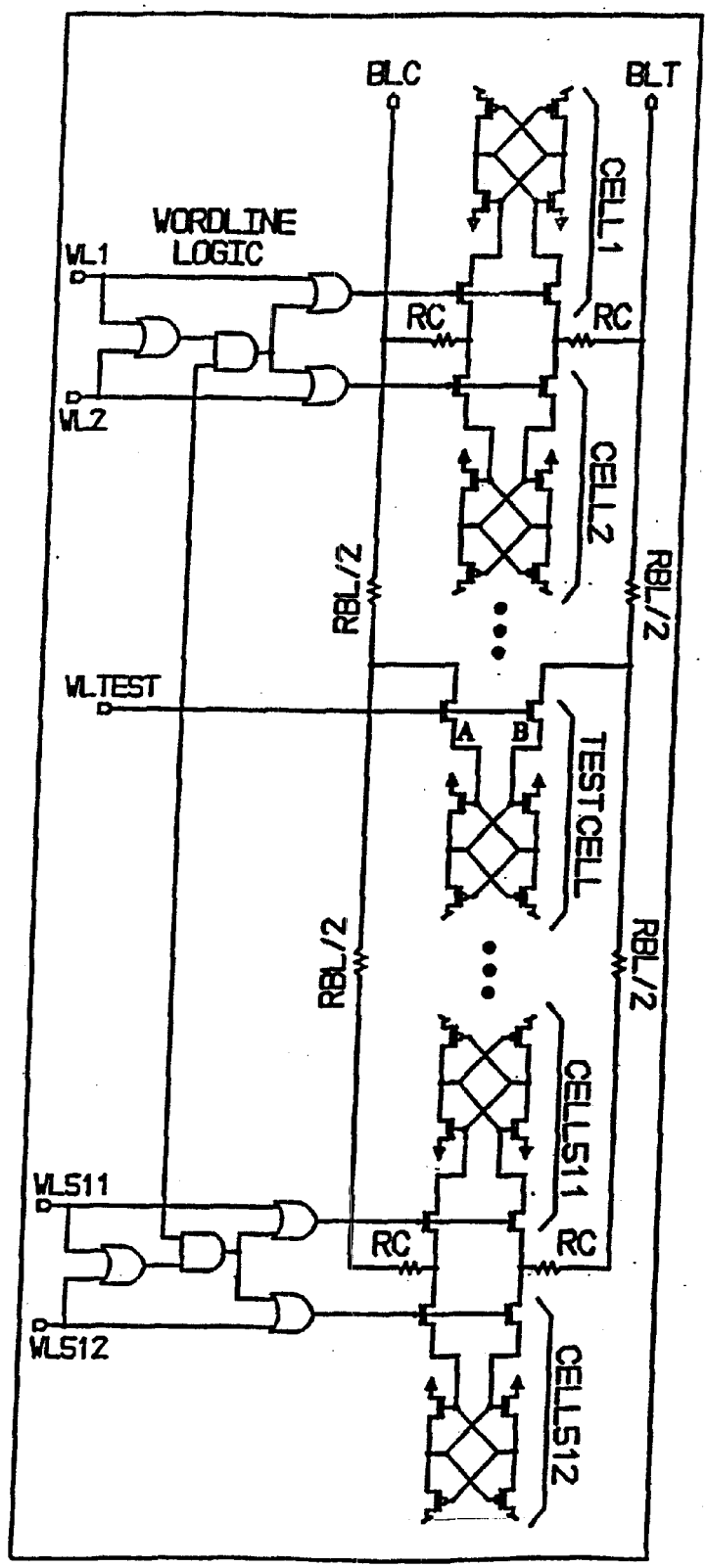
FIG. 5 is a schematic diagram of structure for improving the detection of a resistive bitline contact.

The invention shown in FIG. 7 and discussed in detail below is primarily directed toward producing stress upon the bitline contact of the transistor of the SRAM cell. The invention cannot directly determine the viability of the operation of each memory cell and the associated contacts. Therefore, the invention uses a conventional structure/method, such as that shown in FIG. 5 to test the individual memory cells and detect defective bitlines. However, the invention is not limited to the structure shown in FIG. 5, but instead can be used with any conventional testing mechanism/technique. FIG. 5 illustrates a structure used to improve the detection of bitline contact resistance and is discussed in greater detail in U.S. Pat. No. 6,208,572 (which in incorporated herein by reference).

Figure 1:
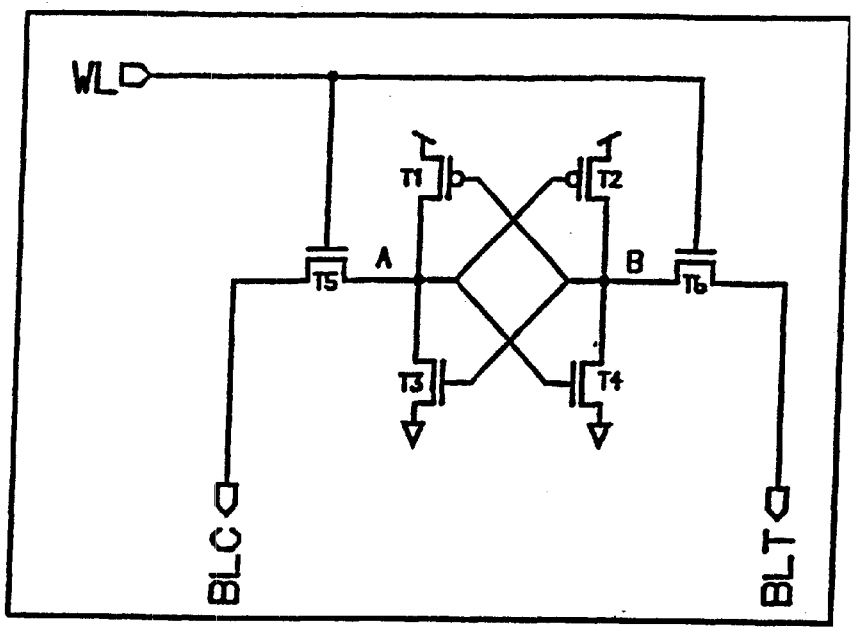
FIG. 1 is a schematic diagram of six-transistor SRAM cell.
Figure 2:
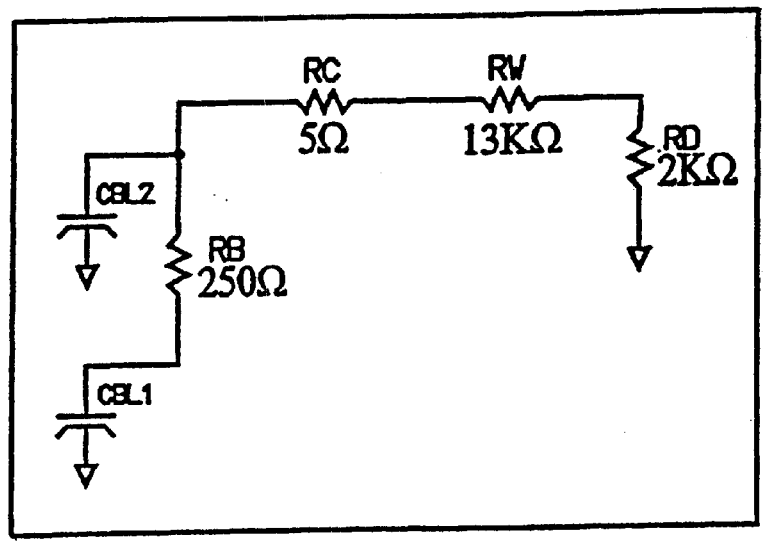
FIG. 2 is a schematic diagram of a bitline and SRAM cell read path simplified model.
Figure 3A:
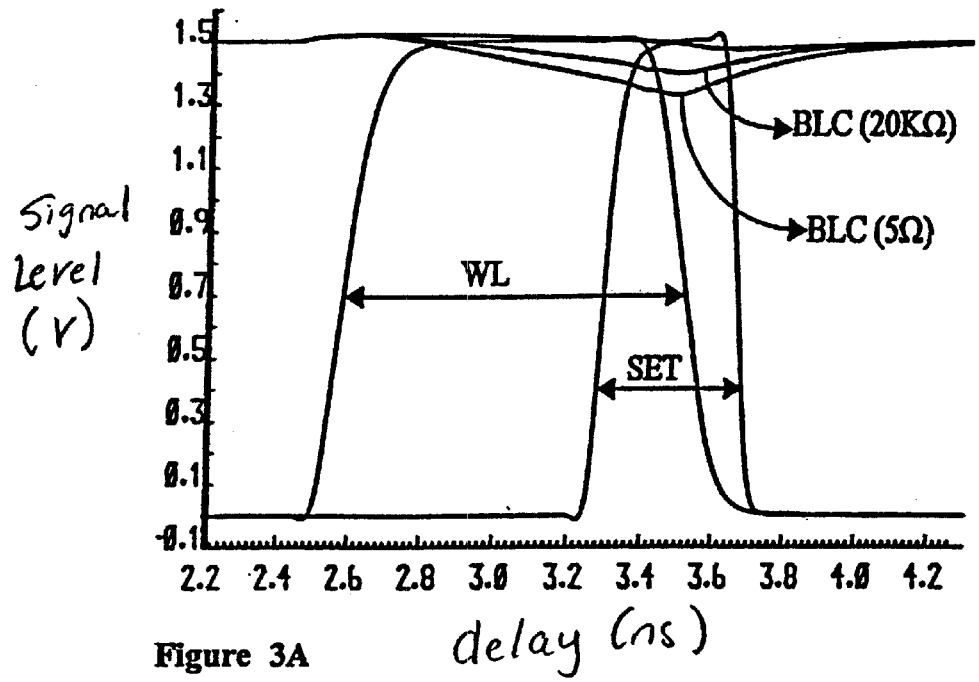
FIG. 3A is a chart showing the read cycle wave forms with the different bitline contact resistances.
Figure 3B:
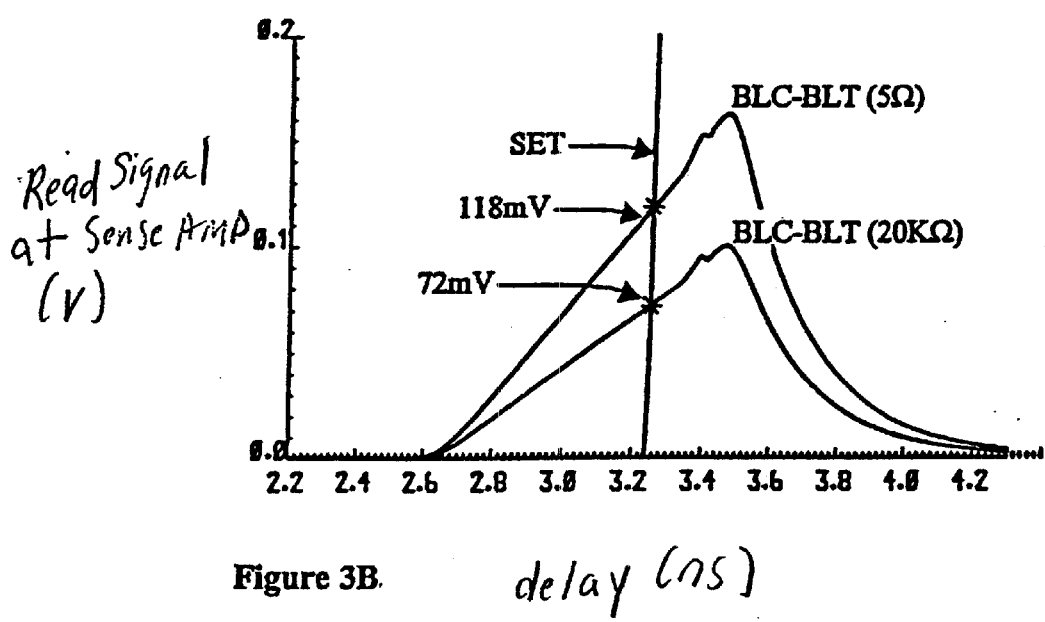
FIG. 3B is a chart showing the difference in the bitline signal at the time the sense-amplifier is set with contacts having different resistances.
Figure 4:
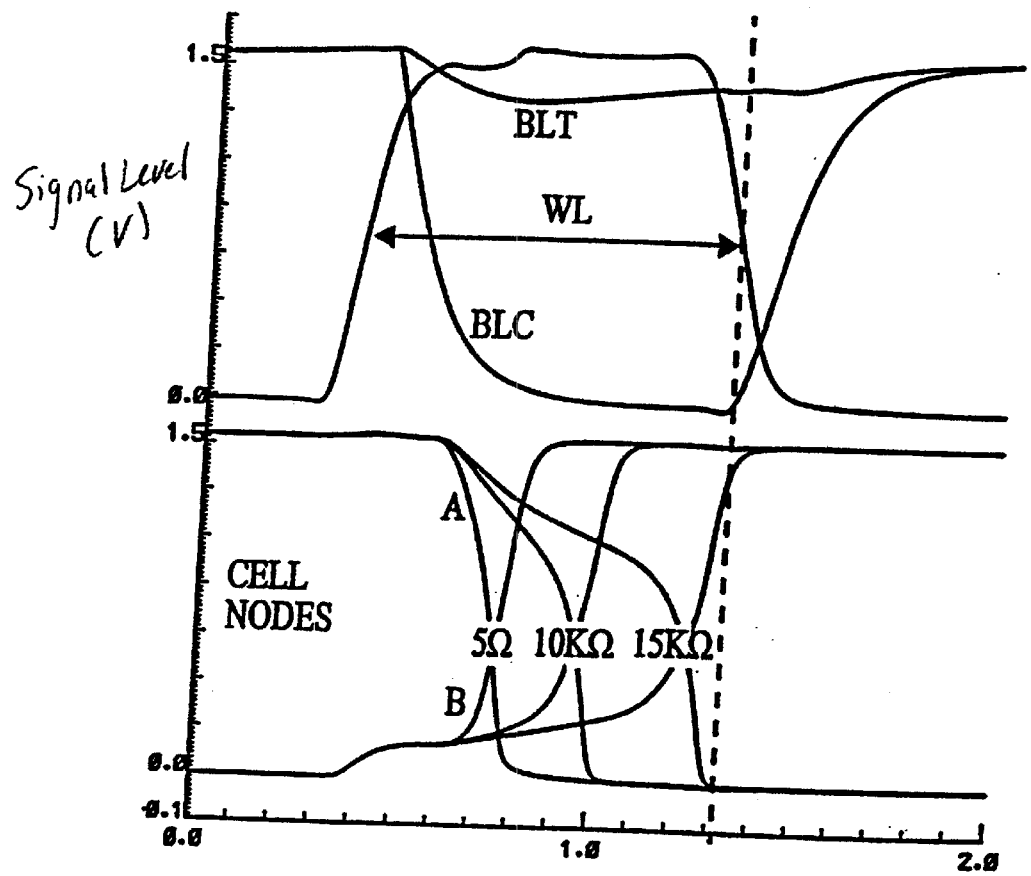
FIG. 4 is a chart showing the write cycle waveforms with different bitline contact resistances.

In conventional SRAM arrays, two vertically adjacent memory cells share a bitline contact. This results in a much denser memory array. The two wordlines of the two vertically adjacent cells sharing a bitline contact are logically controlled by signal WLTEST that activates the two adjacent wordlines simultaneously during the special test mode. The multiple wordline activation logic is also shown in FIG. 5. When both wordlines are activated simultaneously, the two cells are accessed in parallel, resulting in a 2x decrease in resistance of wordline device T5 and latch pull-down device T3. Referring back to FIG. 2, the bitline contact resistance RC, becomes more visible to series wordline device resistance RW, and latch pull-down resistance RD. The values of RW and RD are decreased by one half of what is shown in FIG. 2. This system alone, increases the delectability of conventional read or write operations by 2x. This method also integrates a test cell whose electrical properties are expected to closely track the properties of the main array cells. An example of the test cell integration into the main array is a placement in the middle of a 512-cell bitline, between cells 255 and 256. This placement separates the bitline resistance in half between the test cell and the two furthest cells, cell 1 and cell 512. The test cell is designed to be approximately 90% of the strength of two cells combined. The test cell is also designed with multiple bitline contacts to ensure there is no additional contact resistance when impacted with a manufacturing defect in one of the contacts.

Table 1 shows the test flow used in detecting resistive bitline contacts. The detection method works as follows: 1) cells 1 and 2 are written with a "0" (see FIG. 5); 2) test cell is written with a "1"; 3) the test cell is selected concurrently with cells 1 and 2. Cells 1 and 2 form a parallel cell structure with 2x the strength of one cell. Since the test cell is 10% smaller than the combination of cells 1 and 2, its data is overwritten by cells 1 and 2, unless there is enough bitline contact resistance to prevent the write of the test cell. The test cell data is not overwritten by cells 1 and 2 if there is sufficient bitline contact resistance from cells 1 and 2 to the test cell. This test is repeated with opposite data written to the two cells.

TABLE 1

Test flow for detecting resistive bitline contacts.
Operation

| | |
|---|---|
| 1) | Blanket write "0" cells 1–512 |
| 2) | Write "1" to test cell |
| 3) | Read cells 1 and 2 and test cell concurrently using test mode |
| 4) | Read test cell: "0" = pass (test cell successfully overridden by cells 1 and 2) |
| 5) | Repeat steps 24 with next pair of cells |
| 6) | Repeat 1–5 with opposite data |

Figure 6:
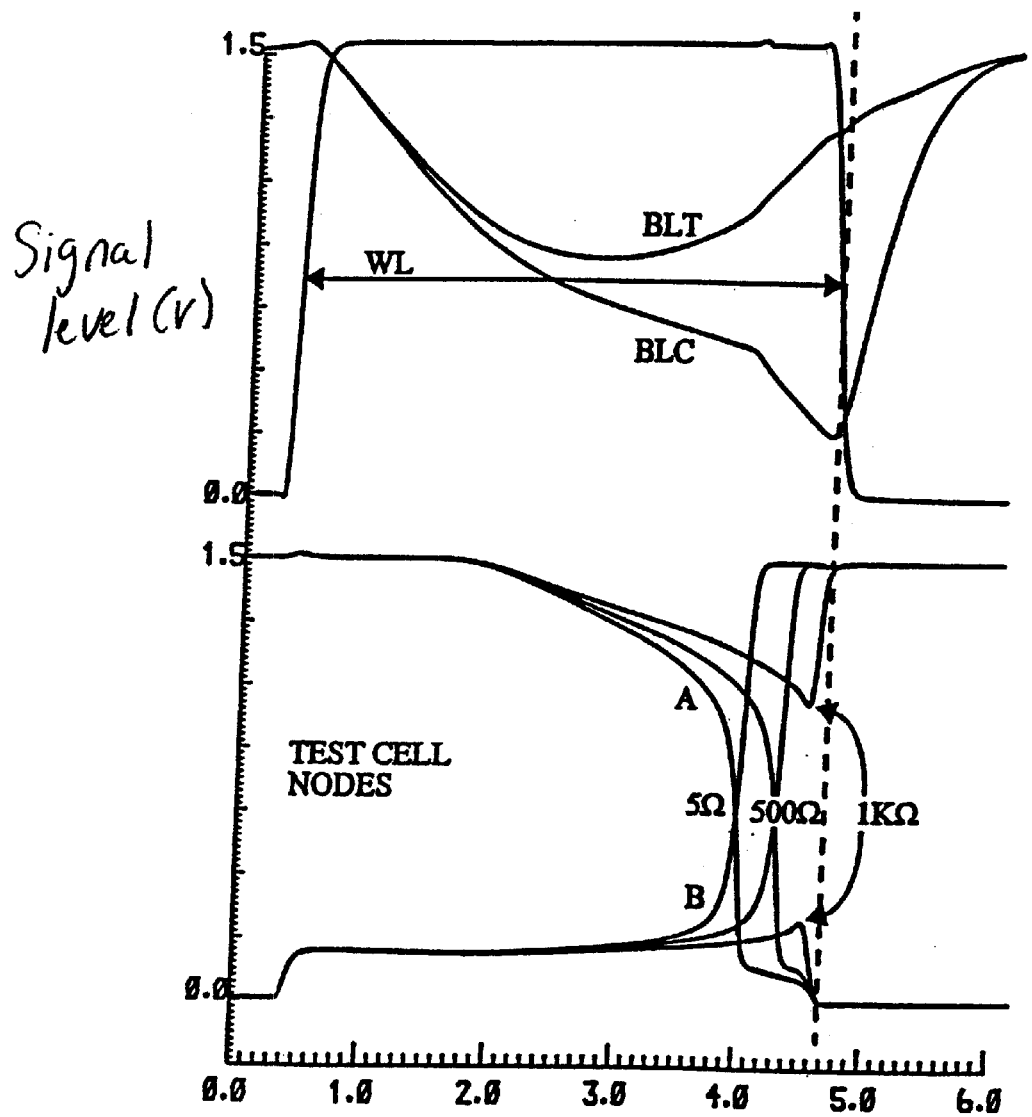
FIG. 6 is a chart showing the waveforms of the write cycles to the test cell with different bit line contact resistances.

FIG. 6 shows the waveforms of the test cell being written with contact resistances of 5Ω, 500Ω and 1 KΩ. The write of the test cell fails to occur when the contact resistance is between 500Ω and 1 KΩ. This is approximately a 20x improvement from the conventional write test described in the previous section. One advantage of this method is that it does not rely on narrow wordline pulses. The pulse width of WLTEST is designed to be wide enough to allow the write to the test cell across the process window, voltage and temperature variations, and RC=5Ω, given the expected tracking of electrical parameters between the test cell and main array cells. The method tests the DC strength ratio between the test cell and the two combined cells under test. The bitline contact resistance, RC is the primary arbiter that allows or prevents the write from occurring.

Figure 7:
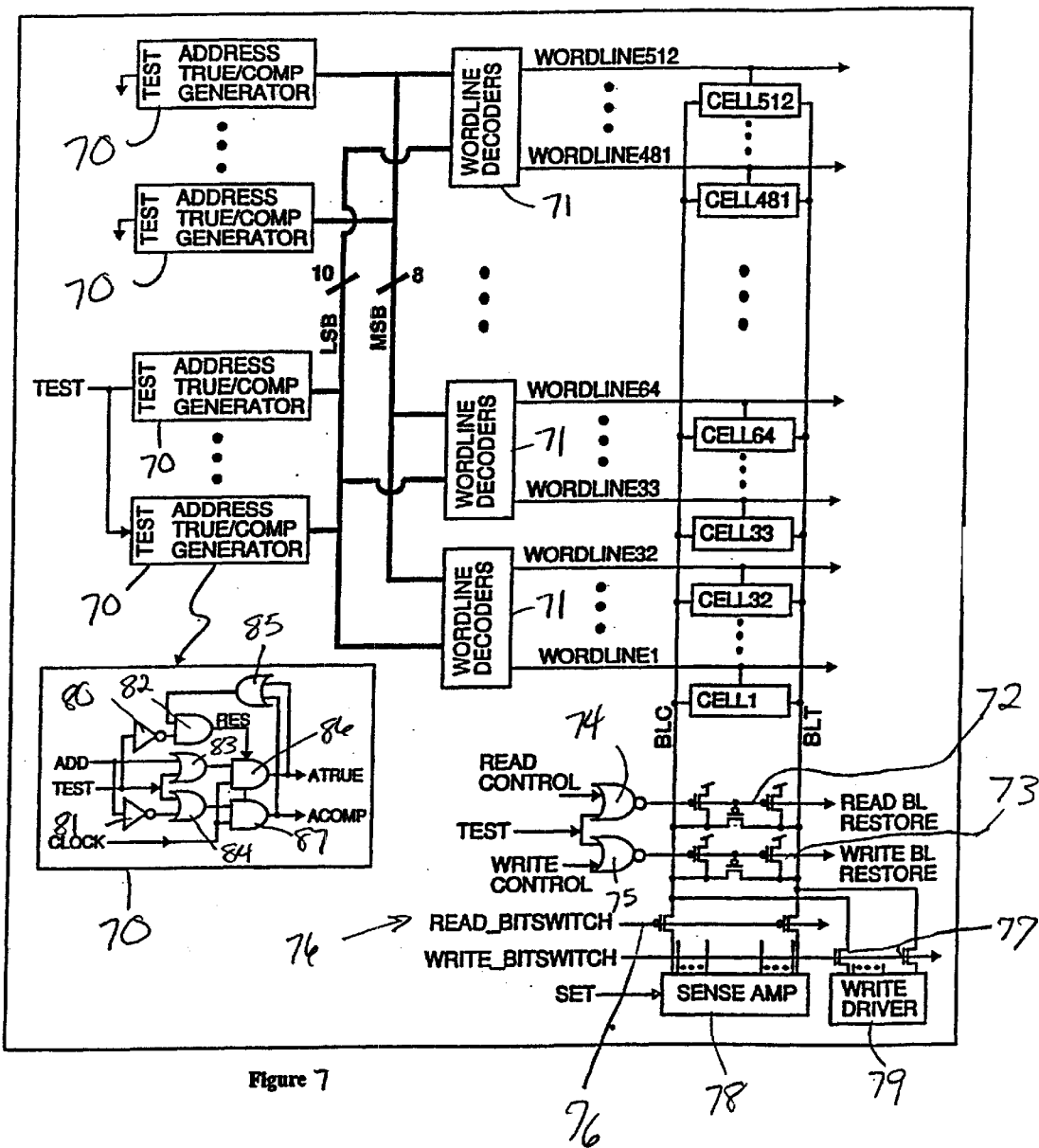
FIG. 7 is a schematic diagram of a structure which implements excessive stress upon the bitlines of the memory array.

Referring now to FIG. 7, a preferred embodiment of the structure used with the invention is illustrated. The invention produces excessive stress upon a given bitline contact by activating multiple wordlines during a read test, maintaining the wordlines in an active state for an extended period of time and, at the same time, allowing the bitline precharge devices to remain active. By this means, a path for current to flow through the bitline contact is provided. By enabling both wordline and precharge paths simultaneously, a DC current path is established.

More specifically, the structure shown in FIG. 7 allows multiple wordlines to be simultaneously activated for an extended period of time and for precharge devices to remain active during a stressing operation. As shown in FIG. 7, the inventive structure includes a number of true and complement address generators 70 as well as wordline decoders 71. Each of the wordline decoders 71 is connected to 32 wordlines. While this embodiment illustrates the wordline decoders 71 being connected to 32 wordlines each, as would be known by one ordinarily skilled in the art given this disclosure, any number of wordlines can be connected to each of the wordline decoders, depending upon the specific structure being tested. The inventive structure also includes read and write bitline restore devices 72, 73 and NOR logic devices 74, 75 with read, test and write control inputs. The read bitswitch is identified as item 76 and the write bitswitch is identified as item 77. The sense amplifier is item 78 and the write driver is item 79. Each of the address generators 70 includes inverters 80, 81, AND logic circuits 82, 86, 87, and OR logic circuits 83, 84, 85.

A stressing mode ("test mode") is enabled during a read cycle by asserting the TEST signal. Write operations remain unchanged. When TEST is asserted during read cycles, 32 wordlines are simultaneously selected by forcing both the true and complement least significant bit (LSB) address inputs to the wordline decoders. This is shown by the TEST control input of the address true/complement generators. TEST signed forces both NOR gates 83 and 84 to be active, thus enabling both true and complement outputs of the generators.

The TEST signal also breaks the self-restore path of all wordline true and complement generators and enables the active pulse width of the wordline to be controlled by the external clock. The TEST signal prevents AND gate 82 from providing the self-resetting function for true and complement outputs. The clock's falling edge resets true and complement outputs through AND gates 86, 87.

In a 200 ns burn-in cycle, the falling edge of the clock can be placed at 198 ns to provide a 198 ns/200 ns wordline-active duty-factor. This is compared to the self-resetting conventional wordline-active time of 900 ps out of the 200 ns burn-in cycle. One read cycle occurs every 200 ns (at burn-in). The longest possible that the wordline can be held high out of the cycle, the more efficient the stress and, as shown by this example, the invention achieves a substantially longer time than conventional method systems.

Another key feature of the invention is the selection of adjacent wordlines within the group of 32 multiple-selected wordlines. Referring back to FIG. 5, a single bitline contact is shared between two adjacent cells. By enabling adjacent wordlines, the read current through the bitline contact is increased two-fold. Referring to FIG. 5, whenever WL1 and WL2 are both active, the current flowing through the bitline contact is from two cells (CELL1 and CELL2), thus providing a 2× increase in current compared to the current of a normal read cycle which would only be from either CELL1 or CELL2.

Finally, the TEST signal also enables bitline read and write restore devices during read cycles. Normally, these PFET devices are switched off prior to the start of read cycles to allow the cell to discharge the bitline before setting the sense-amplifier. The precharge devices are kept on during the test mode to create a current path for all 32 cells that are simultaneously active and maintain a sufficiently high voltage on the bitline. The read and write bitline restore devices are shown by structures 72 and 73 of FIG. 7.

The restore devices 72, 73 are somewhat larger than conventional restore devices because they must apply sufficient voltage to simultaneously maintain 32 cells in a read condition. A small chip area increase results from the larger PFET devices in the bitline restore circuitry 72, 73 that are necessary to maintain the bitline voltage with 32 cells active. Typically, a 2× increase would provide sufficient voltage with 32 cells active. However, a 3× increase will improve the stressing by providing an even higher voltage on the bitlines.

Figure 8:
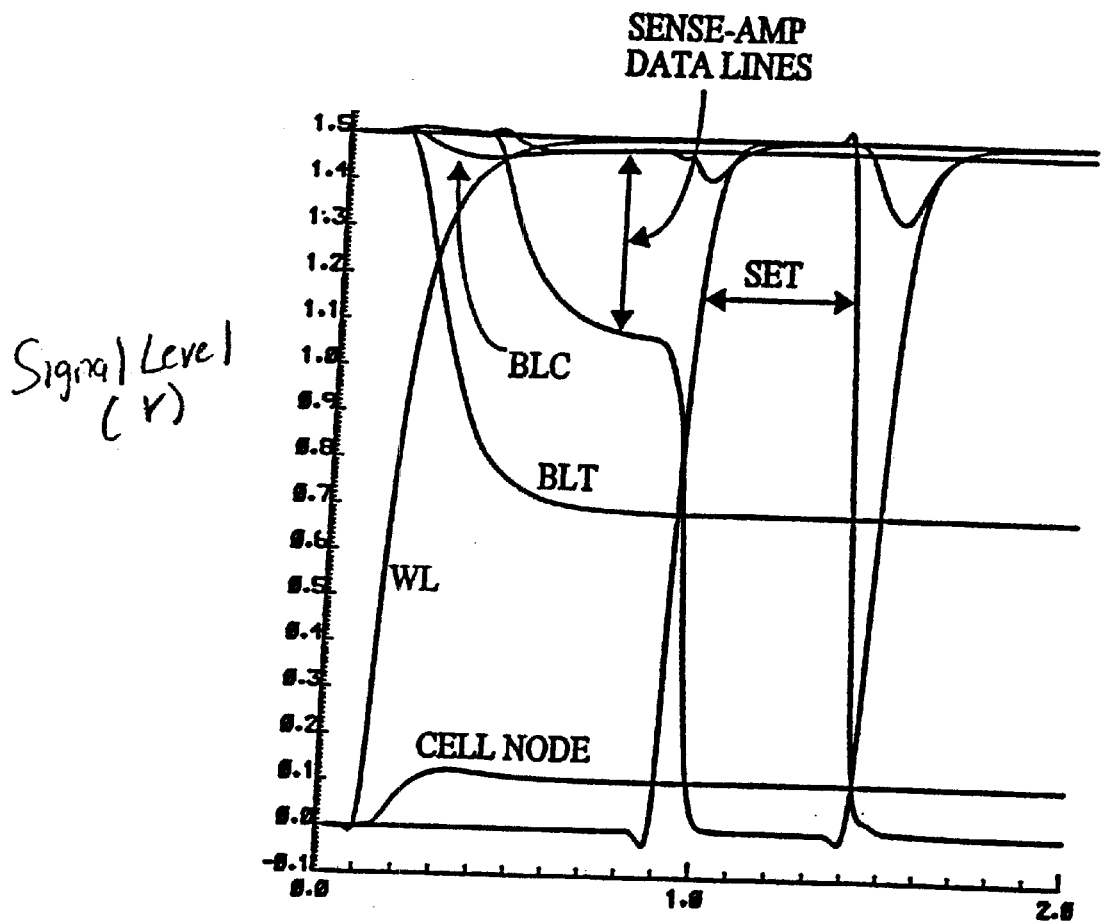
FIG. 8 is a chart showing the waveforms of a test-read cycle.

FIG. 8 shows the waveforms of a test-read cycle with the invention. As shown, the wordline (WL) active time is much longer than a conventional read cycle, but the bit-switch 76, 77 and sense-amplifier 78 timings (SET) are as would be expected in conventional read cycles. This allows the common data in the 32 cells to be read by the tester.

FIG. 8 shows the SET signal pulsing and the activation of data-lines by the SET signal. The 32 active cells cause the bitline excursion (BLT) to be much greater than a conventional read. This is because there are 32 cells that are actively pulling the bitline (BLT) low as opposed to just one cell, as occurs during a normal read operation.

The invention can be easily integrated in high density SRAM arrays with only a small area penalty. The invention is implemented to improve the efficiency of bitline contacts stressing during burn-in. A 9,533× improvement of bitline contact current-stressing is achieved with a very small current penalty (see Table 2). In conventional dense SRAMs, an individual cell only sees a trivial amount of cell switching current. For example, in an 18 Mb SRAM each cell is only stressed every 14.6 million burn-in cycles.

TABLE 2

Duty-cycle improvement.

| Duty Cycle Factors | Conventional Read Cycle | Improved Mode |
|---|---|---|
| Burn in Duty-Cycle Efficiency | 900 ps/200 ns | 198 ns/200 ns |
| Wordline Selection | 1/512 | 32/512 |
| Sub-array Selection | 1/64 | 1/64 |
| Data Type | ½ | ½ |
| Bitline Contact DC Current Scale Factor | — | 65 µa/96 µa |
| Active Cells per Bitline Contact | 1 | 2 |
| Avg. Current per Contact per Million Read Cycles | 6.59 µa | 62.8 ma |
| Efficiency Improvement | 1x | 9,533x |
| Active Current Increase | 0 ma | 19 ma |

The design for testability (DFT) described above, improves stressability of single bitline contacts by increasing the number of wordlines selected and the wordline-active duty cycle time. The increase in current stressing from the invention provides the wear-out mechanism to either fully open a resistive (and defective) bitline contact or increase its resistance to the point where it becomes fully diagnosable. This allows those bitline contacts which are initially only marginally acceptable (and which will probably become defective after some period of use) to be immediately identified directly after manufacture. More specifically, the invention provides a test mode to efficiently stress SRAM cells. Specifically, this test mode is designed to maximize the stress duty-factor of each cell by a factor greater than 10,000 when compared to conventional test methods/structures.

While the invention has been described in terms of preferred embodiments, those skilled in the art will recognize that the invention can be practiced with modification within the spirit and scope of the appended claims.

What is claimed is:

1. An integrated memory structure having a built-in test portion, said integrated memory structure comprising:

memory cells;

bitlines and wordlines connected to said memory cells;

wordline decoders connected to a plurality of said wordlines;

bitline restore devices connected to said bitlines for charging said bitlines during read and write operations; and a clock circuit connected to said wordlines, wherein during a test mode:

said wordline decoders simultaneously select multiple wordlines;

said bitline restore devices maintain said bitline restore devices in an active state; and said clock circuit maintains said multiple wordlines and said bitline restore devices in an active state for a period in excess of a read cycle.

2. The integrated memory structure in claim 1, further comprising transistors connected to said memory cells, wherein said transistors include bitline contacts, and wherein said bitline contacts are stressed during said test mode.

3. The integrated memory structure in claim 1, further comprising address generators connected to said wordline decoders, wherein said address generators include logic that simultaneously activates said multiple wordlines.

4. The integrated memory structure in claim 3, wherein said address generators include an OR circuit that activates both true and compliment addresses simultaneously.

5. The integrated memory structure in claim 1, wherein said multiple wordlines are adjacent to one another.

6. The integrated memory structure in claim 1, wherein two adjacent memory cells sharing a bitline contact are simultaneously selected.

7. The integrated memory structure in claim 1, wherein said memory cells comprises static random access memory (SRAM) cells.

8. A method of testing an integrated circuit memory cell structure comprising:

simultaneously activating multiple wordlines;

maintaining said wordlines in an active state for a test period exceeding a read cycle; and maintaining bitline restore devices in an active state while said wordlines are active.

9. The method in claim 8, wherein said activating of said wordlines comprises activating adjacent wordlines.

10. The method in claim 8, further comprising individually testing memory cells after said test period.

11. The method in claim 8, wherein bitline contacts of said integrated circuit memory cell are stressed during said test mode.

12. The method in claim 8, wherein said process of activating said wordlines is performed by wordline decoders within said integrated circuit memory cell structure.

13. The method in claim 8, wherein said process of maintaining bitline restore devices in an active state is performed by logic circuitry within said integrated circuit memory cell structure.

14. The method in claim 8, wherein timings of a read bitswitch and sense amplifiers are preserved, even when in said test period so that a read function can be performed on all cells.

15. An integrated memory structure having a built-in test portion, said integrated memory structure comprising:

memory cells;

bitlines and wordlines connected to said memory cells;

wordline decoders connected to a plurality of said wordlines;

bitline restore devices connected to said bitlines for charging said bitlines during read and write operations;

a clock circuit connected to said wordlines; and transistors connected to said memory cells, wherein said transistors include bitline contacts;

wherein during a test mode:

said wordline decoders simultaneously select multiple wordlines;

said bitline restore devices maintain said bitline restore devices in an active state;

said clock circuit maintains said multiple wordlines and said bitline restore devices in an active state for a period in excess of a normal read cycle; and said bitline contacts are stressed during said test mode.

16. The integrated memory structure in claim 15, further comprising address generators connected to said wordline decoders, wherein said address generators include logic that simultaneously activates said multiple wordlines.

17. The integrated memory structure in claim 16, wherein said address generators include an OR circuit that activates both true and compliment addresses simultaneously.

18. The integrated memory structure in claim 15, wherein said multiple wordlines are adjacent to one another.

19. The integrated memory structure in claim 15, wherein two adjacent memory cells sharing a bitline contact are simultaneously selected.

20. The integrated memory structure in claim 15, wherein said memory cells comprises static random access memory (SRAM) cells.

21. A method of testing an integrated circuit memory cell structure comprising:

simultaneously activating multiple wordlines;

maintaining said wordlines in an active state for a test period exceeding a read cycle; and maintaining bitline restore devices in an active state while said wordlines are active, wherein bitline contacts of said integrated circuit memory cell are stressed during said test mode.

22. The method in claim 21, wherein said activating of said wordlines comprises activating adjacent wordlines.

23. The method in claim 21, further comprising individually testing memory cells after said test period.

24. The method in claim 21, wherein said process of activating said wordlines is performed by wordline decoders within said integrated circuit memory cell structure.

25. The method in claim 21, wherein said process of maintaining bitline restore devices in an active state is performed by logic circuitry within said integrated circuit memory cell structure.

26. The method in claim 21, wherein timings of a read bitswitch and sense amplifiers are preserved, even when in said test period so that a read function can be performed on all cells.

27. A program storage device readable by machine, tangibly embodying a program of instructions executable by the machine to perform a method for testing an integrated circuit memory cell structure, said method comprising:

simultaneously activating multiple wordlines;

maintaining said wordlines in an active state for a test period exceeding a normal read cycle; and maintaining bitline restore devices in an active state while said wordlines are active.

28. The program storage device in claim 27, wherein said activating of said wordlines comprises activating adjacent wordlines.

29. The program storage device in claim 27, wherein said method further comprises individually testing memory cells after said test period.

30. The program storage device in claim 27, wherein bitline contacts of said integrated circuit memory cell are stressed during said test mode.

31. The program storage device in claim 27, wherein said process of activating said wordlines is performed by wordline decoders within said integrated circuit memory cell structure.

32. The program storage device in claim 27, wherein said process of maintaining bitline restore devices in an active state is performed by logic circuitry within said integrated circuit memory cell structure.

33. The program storage device in claim 27, wherein timings of a read bitswitch and sense amplifiers are preserved, even when in said test period so that a read function can be performed on all cells.

* * * * *